United States Patent
Lou

(10) Patent No.: US 6,277,732 B1
(45) Date of Patent: Aug. 21, 2001

(54) METHOD OF PLANARIZING INTER-METAL DIELECTRIC LAYER

(75) Inventor: Chine-Gie Lou, Hsinchu Hsien (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 09/336,045

(22) Filed: Jun. 18, 1999

(30) Foreign Application Priority Data

May 26, 1999 (TW) ................................................ 88108611

(51) Int. Cl.⁷ .............................................. H01L 21/4763
(52) U.S. Cl. ...................... 438/634; 438/623; 438/637; 438/673; 438/627; 438/643; 438/653
(58) Field of Search .................................... 438/623–624, 438/626–627, 633–634, 637–640, 643, 672–673, 675; 257/759–760

(56) References Cited

U.S. PATENT DOCUMENTS 5,306,947 * 4/1994 Adachi et al. ........................ 257/642
5,506,177 * 4/1996 Kishimoto et al. .................. 438/624
5,516,729 * 5/1996 Dawson et al. ...................... 438/624
5,880,018 * 3/1999 Boeck et al. ........................ 438/619
5,930,677 * 7/1999 Zheng et al. ........................ 438/782
6,008,540 * 12/1999 Lu et al. .............................. 257/758

FOREIGN PATENT DOCUMENTS 0-684642-A1 * 11/1995 (EP) ............................. H01L/21/768

* cited by examiner

Primary Examiner—Charles Bowers
Assistant Examiner—Thanh Nguyen
(74) Attorney, Agent, or Firm—Jiawei Huang; J. C. Patents

(57) ABSTRACT

A method of forming a planarized inter-metal dielectric layer. The method involves completely filling the gaps of densely packed metal line regions with low dielectric constant organic dielectric layer but only partially filling the gaps of loosely packed metal line regions. A low dielectric constant inorganic dielectric layer having a high thermal conductivity is deposited over the organic dielectric layer next. The inorganic dielectric layer also fills the remaining space in the loosely packed metal line regions not yet covered by the organic dielectric layer.

5 Claims, 2 Drawing Sheets

METHOD OF PLANARIZING INTER-METAL DIELECTRIC LAYER

CROSS-REFERENCE TO RELATED APPLICATION

This application claims the priority benefit of Taiwan application Ser. No. 8108611, filed May 26, 1999, the full disclosure of which is incorporated herein by reference.

BACKGROUND OF THE INVENTION

1. Field of Invention

The present invention relates to a method of planarizing an inter-metal dielectric layer of a semiconductor device. More particularly, the present invention relates to a method of forming a planarized inter-metal dielectric layer that has a low dielectric constant (low k).

2. Description of Related Art

Recently, semiconductor manufacturing has advanced into the deep submicron process. Beside the miniaturization of semiconductor transistors so that operating speed of each device is increased, the deployment of innovative materials further boosts the performance and reliability of the devices.

In general, when the distance between neighboring metal lines in a semiconductor circuit is reduced, transmission of electrical signals through the metal lines is delayed. A phenomenon known as resistance-capacitance time delay (or RC time delay) is one of the factors that limit the operating speed of a device.

To reduce the RC time delay, a low resistance material is used to form the metal lines and low dielectric constant material is used to form the inter-metal dielectric layer.

However, low dielectric constant material typically comprises organic polymer. Thermal conductivity of the organic polymer is usually low. Thus, when the inter-metal dielectric layer is formed using the organic polymer, a reliability problem of metal lines may arise.

SUMMARY OF THE INVENTION

Accordingly, the purpose of the present invention is to provide a process for planarizing an inter-metal dielectric layer. Both low dielectric constant organic material and low dielectric constant inorganic material are used to form the inter-metal dielectric layer. Hence, severity of the thermal conductivity problem resulting from the use of organic material in conventional method can be minimized.

To achieve these and other advantages and in accordance with the purpose of the invention, as embodied and broadly described herein, the invention provides a process for planarizing an inter-metal dielectric layer. A substrate having a plurality of metal lines thereon is provided. Some metal lines are formed close to each other, resulting in densely packed metal line regions. In contrast, some of the metal lines are laid further apart, resulting in loosely packed metal line regions. A dielectric liner layer is formed covering the metal lines and the exposed substrate. A nitridation treatment of the dielectric liner layer is carried out. Organic dielectric layer having a low dielectric constant is deposited over the dielectric liner layer so that the densely packed metal line regions are completely filled while the loosely packed metal line region is only partially filled. Using the dielectric liner layer as an etching stop layer, the organic dielectric layer is etched by performing a reactive ion etching operation. Inorganic dielectric layer having a low dielectric constant is deposited over the organic dielectric layer. The inorganic dielectric layer has a thickness greater than the height of the metal lines. A cap dielectric layer is formed over the inorganic dielectric layer, and the cap dielectric layer is planarized by performing a chemical-mechanical polishing operation. A via is formed through the cap dielectric layer, the inorganic dielectric layer, the organic dielectric layer and the dielectric liner layer such that a top surface of the metal line is exposed. An electron beam curing operation is carried out so that the organic dielectric layer on the sidewall of the via is more dense. Lastly, a barrier layer and a metal plug are sequentially formed inside the via.

In this invention, low k organic dielectric layer is used to completely fill the gaps in the densely packed metal line regions, but the gaps in the loosely packed metal line regions are only partially filled. A low k inorganic dielectric layer having a higher thermal conductivity is deposited over the organic dielectric layer next. The inorganic dielectric layer also fills the remaining space in the loosely packed metal line regions not yet covered by the organic dielectric layer.

By filling the gaps in the densely packed metal line regions with low k organic dielectric layer, the dielectric constant of the inter-metal dielectric layer between two adjacent metal lines is lowered. Therefore, the speed of transmission of electrical signals through the metal lines is increased.

By forming a low k organic dielectric layer followed by forming a low k inorganic dielectric layer having a higher thermal conductivity, the metal line regions have a lower overall dielectric constant. Moreover, the higher thermal conductivity of the inorganic dielectric layer also makes the cooling of metal line regions much faster.

In addition, when the dielectric liner layer is formed by chemical vapor deposition, the ratio between oxygen and tetra-ethyl-ortho-silicate (TEOS) gas sources can be suitably adjusted so that a thicker liner layer is formed on the top surface of the metal lines while a thinner liner layer is formed on the sidewalls of the metal lines. The thicker top liner layer is much better at protecting the metal line surface while the thinner sidewall liner layer lowers the dielectric constant of the inter-metal line dielectric layer between two adjacent metal lines.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
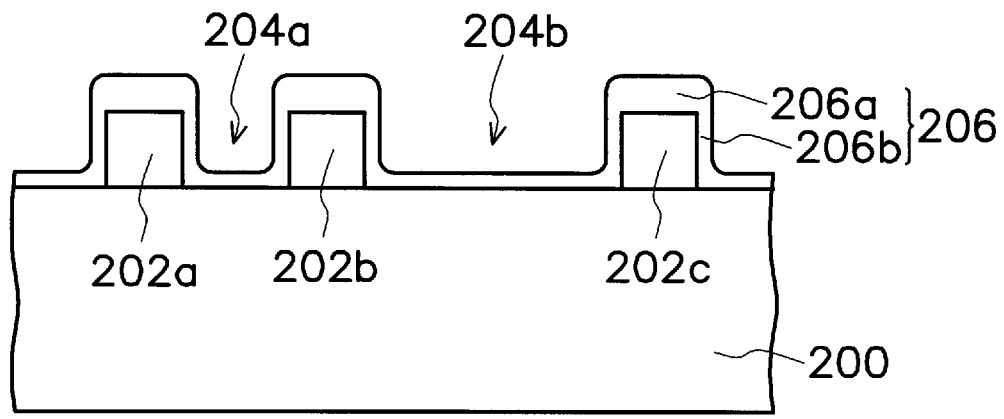
FIGS. 1A through 1E are schematic, cross sectional views showing the progression of steps in the process of an planarizing inter-metal dielectric layer according to this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are schematic, cross sectional views showing the progression of steps in the process of planarizing an inter-metal dielectric layer according to this invention.

As shown in FIG. 1A, a plurality of metal lines 202a, 202b and 202c are formed over a substrate 200. Metal lines 202a and 202b are densely packed, forming a densely packed metal line region 204a. On the other hand, metal lines 202b and 202c are loosely packed, forming a loosely packed metal line region 204b.

A dielectric liner layer 206 is formed over the metal lines 202a, 202b, 202c and the top surface of the substrate 200. The dielectric liner layer 206, for example, can be a silicon oxide layer formed using tetra-ethyl-ortho-silicate (TEOS) and oxygen as gaseous reactants in a plasma enhanced chemical vapor deposition (PECVD) process. If the percentage of oxygen within the gaseous reactant is dropped when the dielectric liner layer 206 is formed, a thicker liner layer 206a is formed on the top surface of the metal lines 202a, 202b and 202c while a thinner liner layer 206b is formed on the sidewalls of the metal lines 202a, 202b and 202c. A thicker liner layer on the top surface of the metal lines 202a, 202b and 202c can prevent some damages of the metal lines caused by subsequent etch operations. Meanwhile, a thinner liner layer on the sidewalls of metal lines 202a, 202b and 202c can lower the overall dielectric constant of the inter-metal dielectric layer between two adjacent metal lines. This is because although dielectric liner layer generally has a higher dielectric constant, decreasing thickness of the sidewall liner layer 206b leaves more room for the deposition of more low k dielectric material. Hence, the overall dielectric constant is actually reduced.

A nitridation treatment of the dielectric liner layer 206 is carried out so that adhesion between the dielectric liner layer 206 and a low k dielectric layer, which is formed in a post-step, is enhanced. The nitridation includes, for example, an $NH_3$ plasma treatment.

Figure 1B:
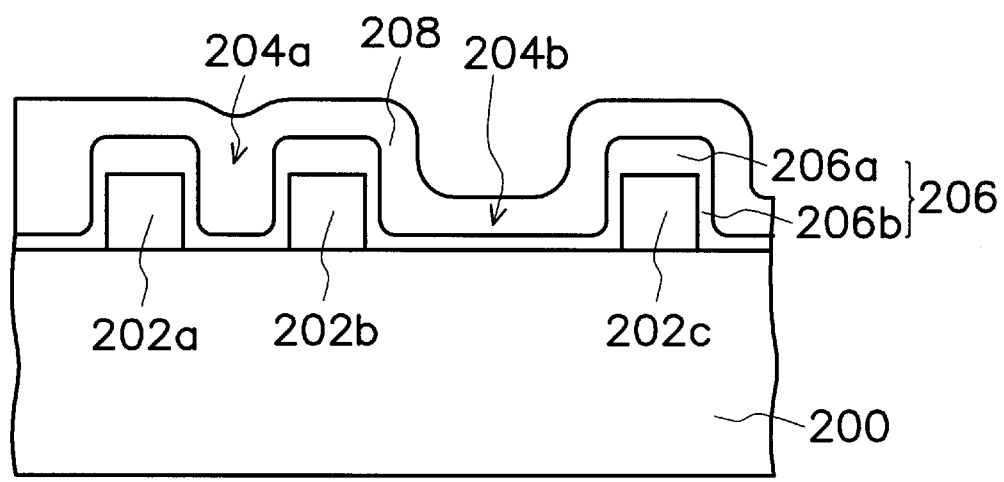

As shown in FIG. 1B, a low k organic dielectric layer 208 is formed over the dielectric liner layer 206. This organic dielectric layer 208 has a dielectric constant less than about 2–3.

The organic dielectric layer 208 is formed using materials such as polyimide, fluorinated polyimide, polymer or FLARE in a spin-on glass (SOG) process, for example. When the organic dielectric layer 208 is formed, gaps in the densely packed metal line regions 204a are completely filled; in contrast, gaps in the loosely packed metal line regions 204b are only partially filled.

Figure 1C:
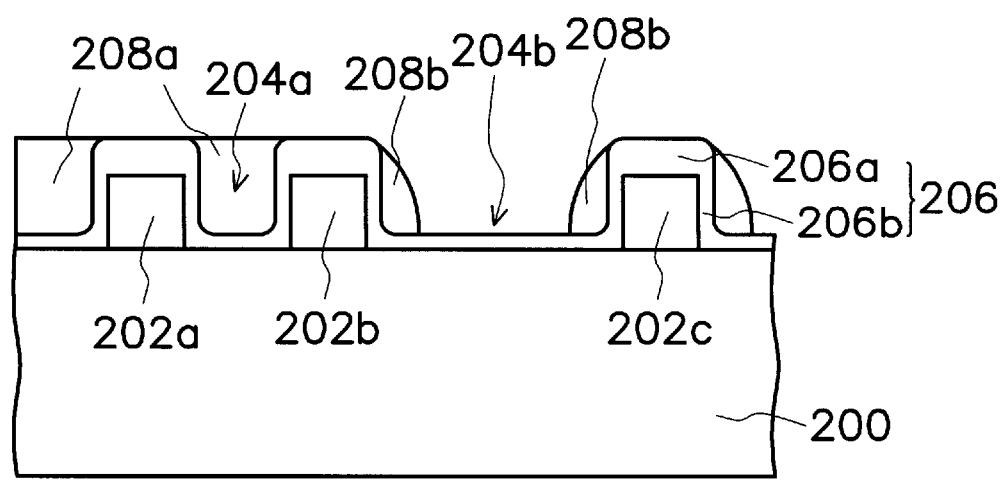

To ensure that all the gaps in the densely packed metal line regions such as 204a are completely filled while the loosely packed metal line regions such as 204b are only partially filled, a reactive ion etching (RIE) operation of the organic dielectric layer 208 may be additionally carried out using the dielectric liner layer 206 as an etching stop layer. FIG. 1C shows the external profiles of the respective organic dielectric layers 208a and 208b within the densely packed metal line regions 204a and the loosely packed metal line regions 204b after the RIE operation.

In the following illustration, however, operations are carried out immediately after the organic dielectric layer 208 is formed, as shown in FIG. 1B, and RIE of the organic dielectric layer 208 is omitted.

Figure 1D:
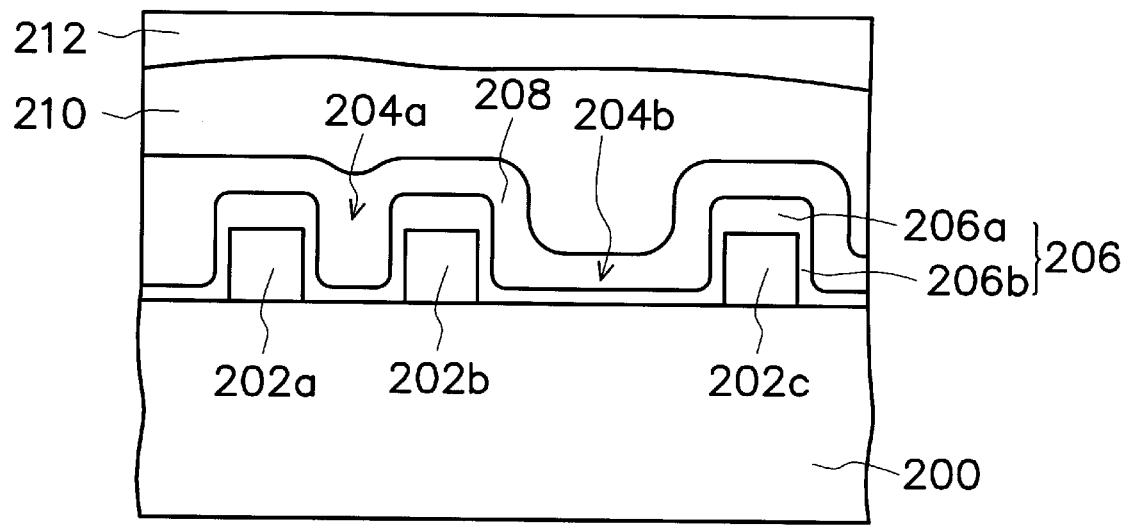

As shown in FIG. 1D, a low k inorganic dielectric layer 210 is formed over the organic dielectric layer 208. The inorganic dielectric layer 210 must have a thickness greater than the height of the metal lines 202a, 202b and 202c so that the gaps in the loosely packed metal line regions 204b are completely filled. The dielectric constant of the inorganic dielectric layer 210 falls between roughly 3 and 4. The inorganic dielectric layer 210 is preferably formed using material such as hydrogen silsesquioxane (HSQ), methylsequioxane (MSQ) or fluorosilicate glass (FSG).

A cap dielectric layer 212 is formed over the inorganic dielectric layer 210. The cap dielectric layer 212 can be a silicon oxide layer formed using a plasma-enhanced chemical vapor deposition method, for example. A planarization operation such as a chemical-mechanical polishing (CMP) operation for increasing the surface global planarity of devices is carried out.

Figure 1E:
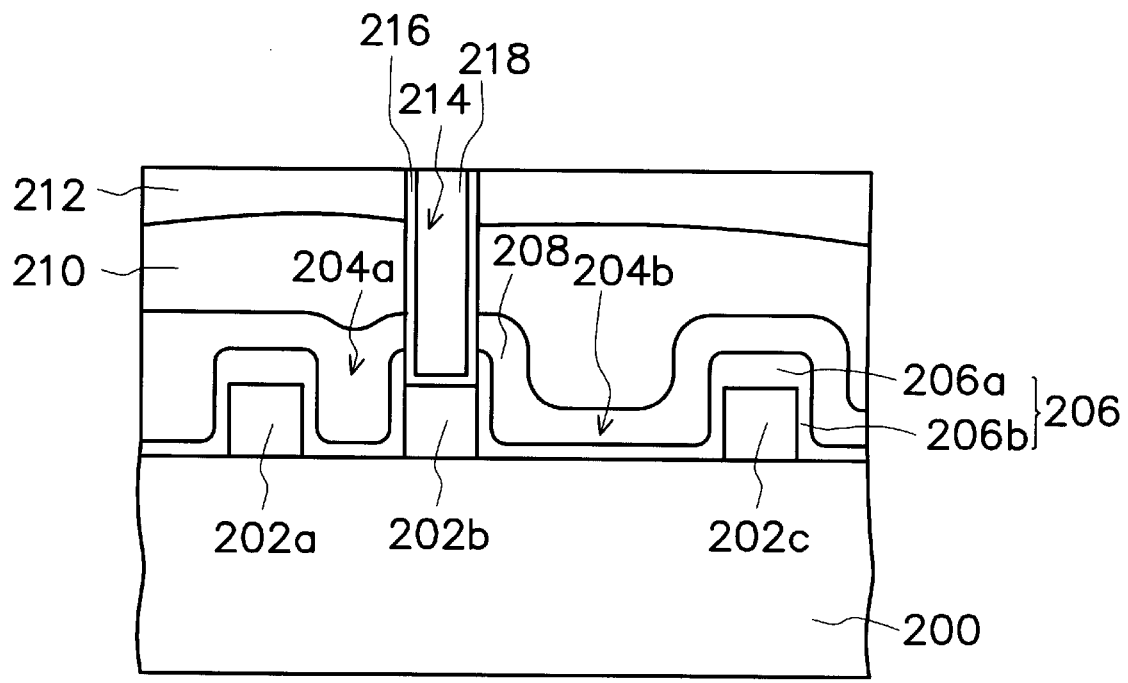

As shown in FIG. 1E, photolithographic and etching techniques are used to form a via 214 that passes through the cap dielectric layer 212, the inorganic dielectric layer 210, the organic dielectric layer 208 and the dielectric liner layer 206. The via 214 exposes a portion of the metal line 202b. An electron beam curing process is carried out so that the exposed sidewalls of the organic dielectric layer 208 inside the via 214 are densed. If a RIE step is performed after the organic dielectric layer 208 is formed, the electron beam curing process can be omitted.

In the subsequent step, a barrier layer 216 is formed, covering the interior surface of the via 214, and a metal plug 218 is formed to fill the remaining space of the via 214. Since these steps are familiar to those skilled in the art of semiconductor manufacturing, detailed description is omitted here.

In this invention, low k organic dielectric layer is used to completely fill the gaps in the densely packed metal line regions completely, but the gaps in the loosely packed metal line regions are only partially filled. A low k inorganic dielectric layer having a higher thermal conductivity is next deposited over the organic dielectric layer. The inorganic dielectric layer also fills the remaining space in the loosely packed metal line regions not yet covered by the organic dielectric layer.

By filling the gaps in the densely packed metal line regions with low k organic dielectric layer, the dielectric constant of the inter-metal dielectric layer between two adjacent metal lines is lowered. Therefore, the speed of transmission of electrical signals through the metal lines is increased.

By forming a low k organic dielectric layer followed by forming a low k inorganic dielectric layer having a higher thermal conductivity, the metal line regions have a lower overall dielectric constant. Moreover, the higher thermal condutivity of the inorganic dielectric layer also makes cooling of the metal line regions much faster.

In addition, when the dielectric liner layer is formed in a CVD process, ratio between oxygen and tetra-ethyl-ortho-silicate gas sources can be suitably adjusted so that a thicker liner layer is formed on the top surface of the metal lines while a thinner liner layer is formed on the sidewalls of the metal lines. The thicker top liner layer is much better at protecting the metal line surface while the thinner sidewall liner layer can lower the dielectric constant of the inter-metal line dielectric layer between two adjacent metal lines.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a planarized inter-metal dielectric layer, comprising the steps of:

provuding a substrate having a plurality of metal lines thereon so that some of the metal lines are packed closer together to form densely packed metal line regions while some of the metal lines are packed quite far apart to form loosely packed metal line regions;

forming a dielectric liner layer on the substrate structure;

performing a nitridation treatment on the dielectric liner layer;

forming a low dielectric constant organic dielectric layer that completely fills the gaps in the densely packed metal line regions but only partially fills the gaps in the loosely packed metal line regions;

performing a reactive ion etching operation on the organic dielectric layer using the dielectric liner layer as an etching stop layer;

forming a low dielectric constant inorganic dielectric layer over the organic dielectric layer such that the inorganic dielectric layer is thick enough to be at a level higher than a top surface of the metal lines;

forming a cap dielectric layer over the inorganic dielectric layer;

planarizing the cap dielectric layer;

forming a via that passes through the cap dielectric layer, the inorganic dielectric layer, the organic dielectric layer, and the dielectric liner layer, and exposes a portion of the metal line;

performing an electron beam curing operation so that properties of exposed sidewalls of the organic dielectric layer inside the via are densed; and forming a barrier layer and a metal plug inside the via.

2. The method of claim 1, wherein the step of forming the dielectric liner layer includes depositing silicon oxide using oxygen and tetra-ethyl-ortho-silicate as gaseous reactants in a plasma enhanced chemical vapor deposition process.

3. The method of claim 1, wherein the dielectric liner layer on the top surface of the metal lines is thicker than the dielectric liner layer on the sidewalls of the metal lines.

4. The method of claim 1, wherein material for forming the organic dielectric layer is chosen from a group consisting of polyimide, fluorinated polyimide, polymer and FLARE.

5. The method of claim 1, wherein the step of forming the inorganic dielectric layer includes using a material chosen from a group consisting of hydrogen silsesquioxane (HSQ), methylsequioxane (MSQ) and fluorosilicate glass (FSG).

* * * * *